United States Patent
Nguyen et al.

(10) Patent No.: US 6,806,512 B2
(45) Date of Patent: Oct. 19, 2004

(54) INPSB/INAS BJT DEVICE AND METHOD OF MAKING

(75) Inventors: Chanh Nguyen, Calabasas, CA (US); Daniel P. Docter, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 4 days.

(21) Appl. No.: 10/264,602

(22) Filed: Oct. 3, 2002

(65) Prior Publication Data

US 2003/0032253 A1 Feb. 13, 2003

Related U.S. Application Data

(62) Division of application No. 09/428,820, filed on Oct. 28, 1999, now Pat. No. 6,482,711.

(51) Int. Cl.[7] ..................... H01L 29/737; H01L 21/331
(52) U.S. Cl. ..................... 257/197; 257/198; 257/201; 438/312; 438/317
(58) Field of Search ............................ 257/197, 198, 257/201; 438/312, 315, 317, 334, 342, 350, 345

(56) References Cited

U.S. PATENT DOCUMENTS

| | | | |
|---|---|---|---|
| 4,395,722 A | 7/1983 | Esaki et al. | 257/191 |
| 5,606,185 A | 2/1997 | Nguyen et al. | 257/197 |
| 5,610,086 A | 3/1997 | Liu et al. | 117/105 |
| 5,663,583 A | 9/1997 | Matloubian et al. | 117/89 |
| 5,721,161 A | 2/1998 | Nguyen et al. | 438/47 |

(List continued on next page.)

FOREIGN PATENT DOCUMENTS

EP   0 746 035 A2   12/1996

JP   57 197877   12/1982

(List continued on next page.)

OTHER PUBLICATIONS

Behet, M., et al., "MOVPE growth of III–V compounds for optoelectronic and electronic applications," XP004017728, *Microelectronics Journal*, vol. 27, No. 4, Great Britain, pp. 297–334 (Jul. 1, 1996).

(List continued on next page.)

*Primary Examiner*—M. Wilczewski
(74) *Attorney, Agent, or Firm*—Ladas & Parry LLP

(57) ABSTRACT

Bipolar junction transistor (BJT) devices, particularly heterojunction bipolar transistor (HBT) devices, and methods of making same are described. A combination of InPSb and p-type InAs is used to create extremely high speed bipolar devices which, due to reduced turn-on voltages, lend themselves to circuits having drastically reduced power dissipation. The described HBTs are fabricated on InAs or GaSb substrates, and include an InPSb emitter. The base includes In and As, in the form of InAs when on an InAs substrate, and as InAsSb when on a GaSb substrate. The collector may be the same as the base to form a single heterojunction bipolar transistor (SHBT) or may be the same as the emitter to form a double heterojunction bipolar transistor (DHBT). Heterojunctions preferably include a grading layer, which may be implemented by continuously changing the bulk material composition, or by forming a chirped superlattice of alternating materials. The grading layer preferably has delta doping planes near its ends to form an electrostatic gradient offsetting the quasi-electric field variation due to the changes in material composition, whereby effective conduction band offset may be substantially eliminated to facilitate speed, and valence band offset increased proportionally to enhance gain.

23 Claims, 3 Drawing Sheets

U.S. PATENT DOCUMENTS

| | | | |
|---|---|---|---|
| 5,831,337 A | 11/1998 | Sato | 257/780 |
| 5,907,165 A | 5/1999 | Hamm et al. | 257/197 |
| 5,920,231 A * | 7/1999 | Ando et al. | 330/61 R |
| 6,133,593 A | 10/2000 | Boos et al. | 257/194 |
| 6,232,624 B1 | 5/2001 | Matloubian et al. | 257/194 |
| 2003/0062538 A1 * | 4/2003 | Kudo et al. | 257/197 |

FOREIGN PATENT DOCUMENTS

| | | |
|---|---|---|
| JP | 02 189931 | 7/1990 |
| JP | 03 088369 | 7/1991 |
| JP | 03 241840 | 10/1991 |
| JP | 63 281464 | 11/1998 |

OTHER PUBLICATIONS

Dodd, Paul E., et al., "Demonstration of npn InAs Bipolar Transistors with Inverted Base Doping," XP000584763, *IEEE Electron Device Letters*, vol. 17, No. 4, New York, pp. 166–168 (Apr. 1, 1996).

* cited by examiner

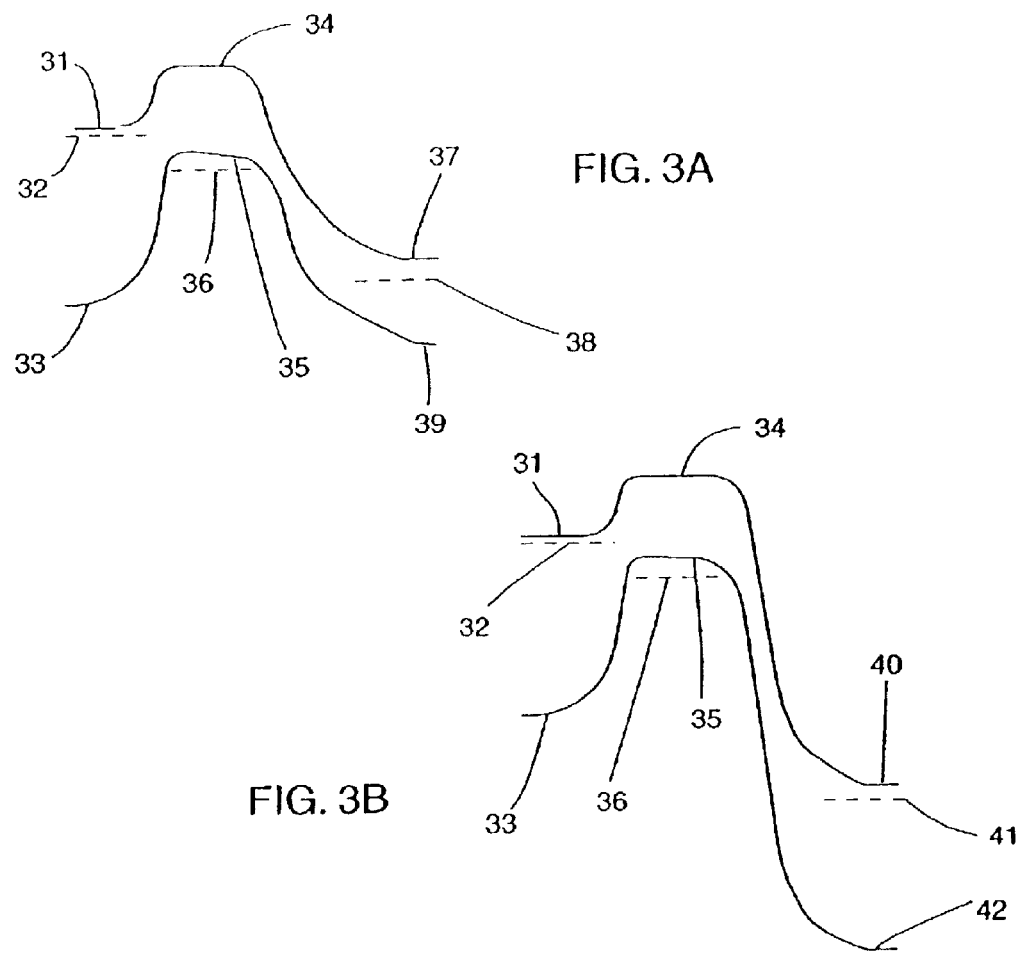
FIG. 3A
FIG. 3B
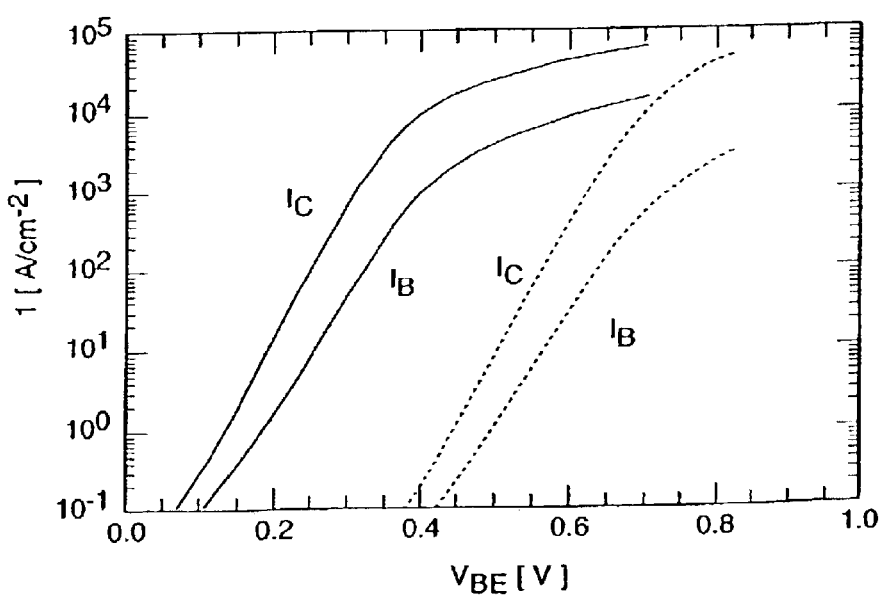
FIG. 4

INPSB/INAS BJT DEVICE AND METHOD OF MAKING

This is a divisional of U.S. Ser. No. 09/428,820, now U.S. Pat. No. 6,482,711, filed on Oct. 28, 1999.

TECHNICAL FIELD

The present invention relates to Bipolar Junction Transistors (BJTs) using InAs-based or InSb-based semiconductor materials, and in preferred embodiments describes Heterojunction Bipolar Transistors (HBTs).

BACKGROUND OF THE INVENTION

Bipolar Junction Transistors, of course, remain among the most widely used semiconductor devices. Heterojunction Bipolar Transistors (HBTs) find use in a number of high power, microwave applications, including cellular telephones, telecommunication equipment, radar equipment, etc. Compared with other devices which operate in the microwave range, such as Gallium Arsenide (GaAs) Field Effect Transistors (FETs), HBT devices realize higher gain amplification in the microwave range. However, as is generally known, an HBT device operates at a relatively high current density, and thus prior art HBTs have inevitably generated heat at a relatively high rate with respect to the device's area. In order to operate such a prior art HBT, special steps have sometimes been taken to conduct the heat generated at a PN junction formed on a surface of a substrate of an HBT away from the device's substrate. One prior art technique for releasing internally generated heat from an HBT is discussed in U.S. Pat. No. 5,831,337 of Sato.

Both Single Heterojunction Bipolar Transistors (SHBTs) and Double Heterojunction Bipolar Transistors (DHBTs) are known in the prior art. Generally speaking, in a SHBT, only the emitter has a wider bandgap than the bandgap of the base, while in a DHBT, both the emitter and the collector have a wider bandgap than that of the base. Indium Phosphide (InP) is commonly used as a substrate material upon which group III-V semiconductor devices are formed from layers of semiconductor materials such as AlInAs and GaInAs. While such devices have high speeds desirable for microwave applications, they tend to consume a fair amount of power, which gives rise to the heat generation problems noted above.

As such, there is a continuing need to reduce the power consumption of HBT devices, and the present invention addresses that need. Moreover, there is a continuing need for devices which can operate at still higher frequencies and the present invention addresses that need as well.

BRIEF DESCRIPTION OF THE INVENTION

The present invention relates to a novel class of BJTs which use p-type InAs. In the preferred embodiments, such a BJT takes the form of an HBT employing InSb-based compositions, particularly InPSb, as a wide-bandgap material. One preferred SHBT embodiment of the invention has an n-type InPSb emitter, p-type InAs base, and n-type InAs collector, while a preferred DHBT embodiment has an n-type InPSb emitter, p-type InAs base, and n-type InPSb collector. These devices may be grown lattice-matched to an InAs substrate. Devices according to the present invention may also be grown lattice-matched on a GaSb substrate by adding Sb to the materials. Thus, other preferred embodiments have an n-type InPSb emitter, a p-type InAsSb base (preferably $InAs_{0.91}Sb_{0.09}$), and an n-type InAsSb collector (for a SHBT) or an n-type InPSb collector (for a DHBT). These 6.1 Å compound semiconductor materials have superior transport properties that result in BJTs with very high speed. The preferred embodiments use these 6.1 Å compounds in combinations that provide opportunities for greatly reduced power consumption. Consequently, devices according to the present invention are particularly useful for digital signal processing applications.

BRIEF DESCRIPTION OF THE FIGURES

FIG. 3A is a schematic energy band diagram of an npn InPSb/InAs SHBT.

FIG. 3B is a schematic energy band diagram of an npn InPSb/InAs/InPSb DHBT.

FIG. 4 shows a comparison between the measured Gummel plot of an InP-based HBT and an estimated plot for an Sb-based HBT taking into account the energy gap difference of the base material.

DETAILED DESCRIPTION

This invention relates to an Sb-based materials system for HBTs which can be lattice-matched to either InAs or GaSb substrates with much more advantageous properties than prior art InP-based HBTs. InPSb is used for a wider bandgap emitter and collector material while InAs is used for a narrower gap base material. For lattice matching to InAs, the composition of the wide gap material is preferably $InP_{0.69}Sb_{0.31}$. For lattice matching to GaSb, the alloys are $InP_{0.63}Sb_{0.37}$ and $InAs_{0.91}Sb_{0.09}$. InAs and GaSb substrates have lattice constants of approximately 6.1 Å. Since the respective lattice matched compositions differ very slightly, the materials properties will be very much the same. For the purpose of this disclosure, we will first discuss compositions which are lattice matched to an InAs substrate. By changing the corresponding compositions of the emitter, base, and collector slightly HBTs can be realized which are lattice matched to GaSb where the same ideas and advantages will apply.

Figure 1:
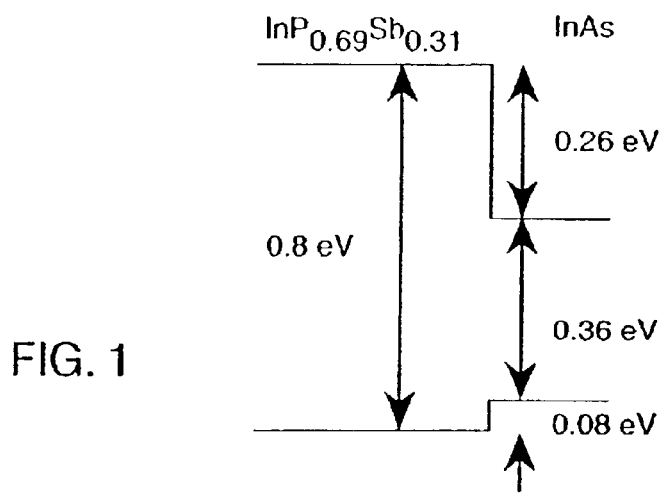
FIG. 1 shows the band alignment of $InP_{0.69}Sb_{0.31}$ and InAs at flat band condition.

FIG. 1 shows the band alignment of $InP_{0.69}Sb_{0.31}$ and InAs at flat band condition. The values of the band offsets are obtained from calculations based on the model-solid theory of Van de Walle and Martin. $InP_{0.69}Sb_{0.31}$ has a direct energy gap of 0.8 eV with a conduction band offset $\Delta E_C$ of 0.26 eV and valence band offset $\Delta E_V$ of 0.08 eV relative to InAs. InAs has a direct energy gap of 0.36 eV at room temperature. Although the relatively large $\Delta E_C$ and small $\Delta E_V$ would appear unattractive for HBTs, the techniques of bandgap engineering can be applied to transfer the entire $\Delta E_C$ into the valence band, therefore creating an effective hole barrier of 0.34 eV. This bandgap engineering technique has been described in detail in U.S. Pat. Nos. 5,721,161 and 5,606,185 which are hereby incorporated herein by reference. However, the procedural steps to eliminate $\Delta E_C$ at the base-emitter junction using a linear-delta scheme will be briefly outlined, and the fabrication details explained more fully later. For DHBTs the same procedure is also carried out at the base-collector junction.

First, instead of using an abrupt InPSb/InAs metallurgical interface, the junction is graded linearly in composition from InPSb to InAs over a certain length, 50 nm for example. The length of the grading is a tradeoff between speed and breakdown voltage; a longer grading junction results in higher breakdown voltage, while a shorter grading distance results in higher speed. Grading junctions are typically 20 to 100 nm. The graded junction causes the quasi-electric field due to the material variation to vary linearly across the grading layer.

Figure 2A:
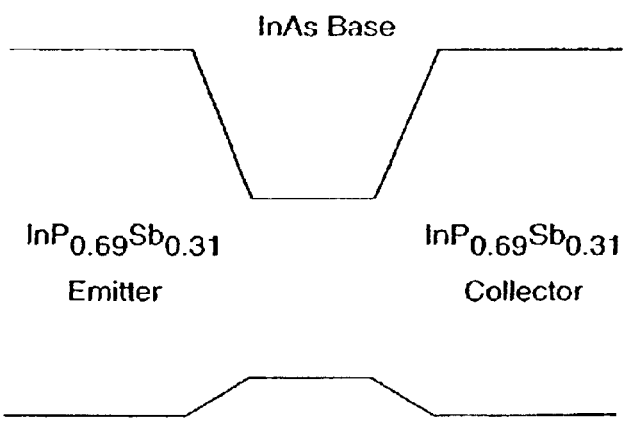
FIG. 2(a) shows the flat band diagram for a DHBT structure having two linearly graded junctions.
Figure 2B:
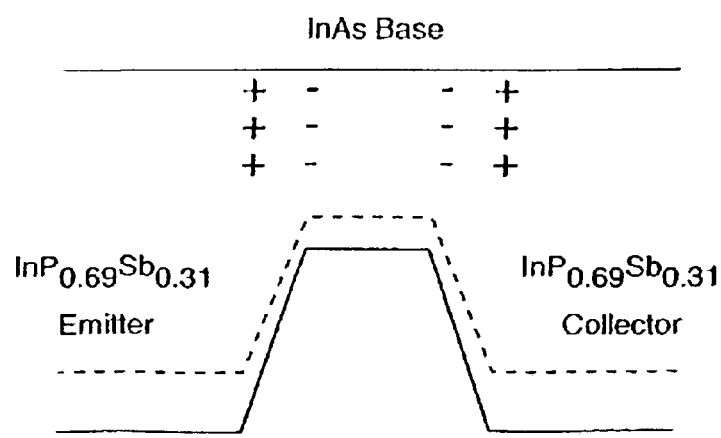
FIG. 2(b) shows the band alignments effected for a DHBT structure as in FIG. 2(a) by grading and doping to transfer conduction band offset into the valence band from the conduction band.

Then, special delta doping planes (layers having minimal thickness, and being doped to establish an appropriate charge in that "plane") are established at the ends of the grading layer. Because the delta doping planes are within the depletion region of the junction, n-doped planes lose their loose electrons and thereby become a positively charged plane, while p-doped planes collect loose electrons and thus provide a plane of negative charge. The delta doping establishes planes of a particular charge separated by the grading layer thickness, creating an electrostatic field which varies linearly between the planes and thus is coextensive with the grading layer. The electrostatic field from the planes, thus superimposed, cancels the quasi-electric field variation due to the shift in materials. The device, which without the grading and doping would have had a large conduction band discontinuity impeding electron flow across the junction, will have little or no conduction band discontinuity, and moreover will have transferred that conduction band discontinuity to enhance the valence band discontinuity (where it will enhance gain). FIG. 2(a) shows schematically the linear bandgap variation in a DHBT due to grading layers 15 and 13. FIG. 2(b) indicates the delta doping charge planes 17(a),(b) as "+" charge symbols, and planes 18(a),(b) as "−" charge symbols. The electrostatic field created by these delta doping planes cancels the quasi-electric field created by the linear bandgap variation, resulting in the effective band lineups shown. As can be seen, the conduction band energy minimum is effectively constant, and the valence band has acquired the offset previously in the conduction band, thereby enhancing the gain of the structure. Thus, FIG. 2(b) shows the desirable effects of grading and doping in transferring the conduction band offset into the valence band for a DHBT structure.

FIGS. 3A and 3B are schematic energy band diagrams of an InPSb/InAs npn SHBT and an InPSb/InAs/InPSb npn DHBT, respectively, under ordinary biasing conditions. For the npn SHBT of FIG. 3A, the emitter conduction band, Fermi level and valence band are identified at 31, 32 and 33. Conduction band, valence band and Fermi levels of the base are indicated at 34, 35 and 36; and of the collector at 37, 39 and 38 respectively. The same items are identified in FIG. 3B for the npn DHBT as 31, 32 and 33 for the emitter, 34, 35 and 36 for the base and 40, 42 and 41 for the collector. The base and emitter operate so similarly that the same reference numbers are used for both. The collector bandgap of the SHBT is narrow (about 0.36 eV) and hence this device is suitable for relatively low $V_{CE}$ applications. The DHBT collector bandgap is much larger, about 0.8 eV, which enables the DHBT to sustain much larger $V_{CE}$. Accordingly, in FIG. 3B the DHBT is shown operating at a $V_{CE}$ higher than that of the SHBT of FIG. 3A. This higher $V_{CE}$ is reflected in the collector Fermi level 41 for the DHBT which is substantially lower than collector Fermi level 38 for the SHBT. The higher $V_{CE}$ capability of the DHBT is often desirable, but it may not be required in circuits taking advantage of the very low $V_{BE}$ of these InPSb/InAs devices.

The very low $V_{BE}$ turn-on voltage of these devices is another benefit of the combination of grading and doping the heterojunctions, which permits the turn-on voltage to be determined by the narrow bandgap of the base. Therefore, with an InAs base, both the SHBT and DHBT will have a $V_{BE}$ turn-on voltage approximately 0.3–0.4 V lower than that of prior art InP-based AlInAs/GaInAs or InP/GaInAs HBTs (the energy gap of $Ga_{0.47}In_{0.53}As$ is 0.78 eV). FIG. 4 shows a comparison between the measured Gummel plot of an InP-based HBT (dashed line plots) and an estimated one for an Sb-based HBT according to the present invention (solid line plots), taking into account the energy gap difference of the base material. The reduction in turn-on voltage will result in at least a factor of 2 reduction in power dissipation per transistor in low power digital Integrated Circuits (ICs) designed around a device according to the present invention. The lower $V_{BE}$ permits use of lower $V_{CE}$ without compromising noise margins, and thus it not only directly reduces saturation power, but it also dramatically reduces switching power. Besides the low turn-on voltage, the Sb-based HBTs of the present invention will also be superior to InP-based HBTs in high speed performance, for devices with the same geometry, due to shorter base and collector transit times. The speed advantage derives from differences summarized in Table I, where the intrinsic electron mobilities and electron effective masses for materials with approximately 6.1 Å lattice constant are compared with the reference values for GaInAs.

TABLE I

| Material | Electron Mobility at 300 K ($cm^2$/Vs) | Electron Effective Mass ($m_0$) |
| --- | --- | --- |
| GaInAs | 14,000 | 0.041 |
| AlSb | 200 | 0.12 |
| GaSb | 5,000 | 0.042 |
| InAs | 33,000 | 0.023 |
| InPSb* | 28,000 | 0.058 |

*The mobility and effective mass of electrons in InPSb are estimated by a linear interpolation between those of InP and InSb.

The shortest base transit time will be achieved with an InAs base. Although the mobilities in Table I are intrinsic values which do not take into account ionized impurity scattering in the base, the high intrinsic value and small electron effective mass (impurity scattering limited mobility varies as $m^{-a}$ where .a is between ½ and 1) of InAs will yield the shortest base transmit time for a given base doping and thickness. For applications in which manufacturability is more important, an alternative to fabricating faster devices using the same geometry is to relax the scaling requirement (e.g., use a thicker base and larger emitter area), which can still achieve the performance of more aggressively scaled state-of-the-art InP-based devices. In addition to enhanced manufacturability, such Sb-based device would retain an advantage in power dissipation compared with the more aggressive InP devices.

A possible drawback of an InAs collector in a SHBT, depending on specific applications, is its narrow bandgap which results in a low impact ionization breakdown. If a higher breakdown voltage is required, one can instead use a DHBT with an InPSb collector instead of an SHBT (FIGS. 3(a) and 3(b)). The relationship between these Sb-based SHBT and DHBT devices will be completely analogous to the relationship between an InP-based SHBT (with a GaInAs base and collector) and DHBT (with an InP collector), which are well known in the art. The Sb-based devices, as noted above, will operate at a much lower power level and with a much higher speed for the same device geometry than their InP-based counterparts, but the relative tradeoffs between SHBT and DHBT devices will be analogous to the tradeoffs between InP-based SHBT and DHBT devices.

Figure 5:
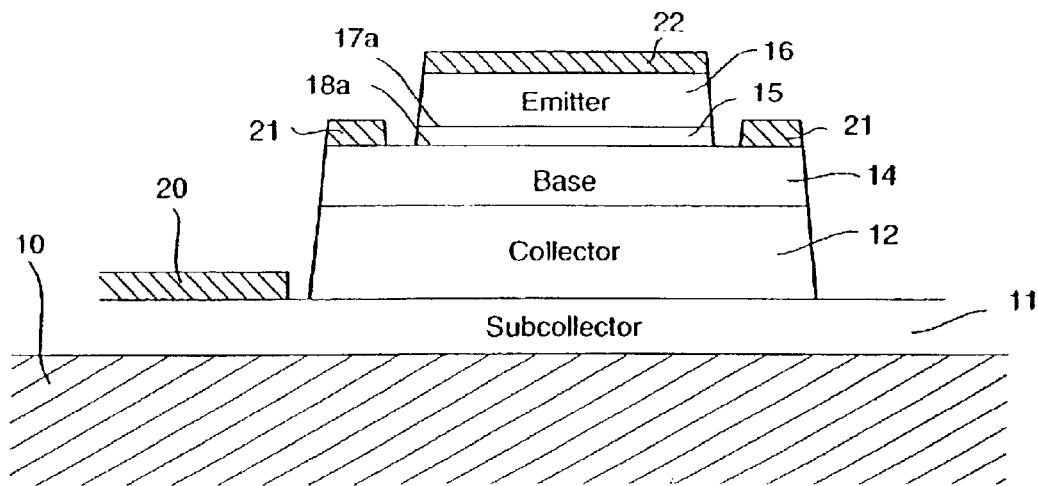
FIG. 5 depicts an Sb-based SHBT device which utilizes the concepts related above.

Turning now to FIG. 5, a SHBT device according to the present invention is depicted in cross section. The device is formed on a suitable substrate 10 such as InAs or GaSb. Layer 11 is preferably lattice matched to substrate 10. Hence, if the substrate is InAs, then a layer 11 of doped n$^+$InAs is typically formed thereon, while if the substrate is GaSb, then layer 11 is doped n$^+$InAs$_{0.91}$Sb$_{0.09}$. In either case, after suitable etching, this layer becomes subcollector 11. Layer 11 may have a wide range of thicknesses depending on application, as with prior art devices, but typically has a thickness on the order of 5000 Å. Layer 11 is typically heavily doped to minimize resistivity, typically to a concentration of about $2 \cdot 10^{19}$ cm$^{-3}$. For the SHBT device, a layer 12 is formed on layer 11, preferably also lattice-matched to substrate 10 and layer 11, and thus being typically the same material as layer 11, InAs or InAs$_{0.91}$Sb$_{0.09}$. However, layer 12 will form the collector and so is typically much less heavily doped than layer 11, typically to a concentration of about $5 \cdot 10^{15}$ cm$^{-3}$. For both layers 11 and 12 the Sb content, if any, is small, and therefore standard dopants may be used—typically Si, with alternatives including Sn and Te. Layer 12, like layer 11, may take on a wide range of thicknesses depending upon application, but is typically about 5000 Å, and is n-type doped.

The base is formed (by suitable masking and etching) from base layer 14 of p-type InAs formed on layer 12. Base layer 14 preferably has a thickness of about 500 Å, and being thin provides less concern for lattice-matching. For the SHBT, the base layer is preferably the same material as layers 11 and 12, typically InAs or InAsSb. Layer 14 is p-type doped, preferably heavily, typically to a concentration of about $3 \cdot 10^{19}$ cm$^{-3}$ and may use Be or C as the dopant.

Grading layer 15 is formed on the base layer 14, separating it from emitter layer 16. Grading layer 15 preferably has, as previously mentioned, a thickness of about 50 nm. Grading layer 15 may be either an InPSb/InAs chirped superlattice or an InPSbAs quaternary compound formed by continuously varying the y-parameter of the quaternary In(P$_{0.69}$Sb$_{0.31}$)$_y$As$_{1-y}$, from 0 at base layer 14, to 1 at emitter layer 16.

Chirped Superlattice Grading Layer

The chirped superlattice embodiment of a grading layer preferably includes a series of interleaved sublayers of InPSb and InAs. The combination of one sublayer of each type forms a "period" of the superlattice, and will be referred to as a "period layer" which includes one sublayer of InPSb and another of InAs. The InPSb sublayers of period layers nearest the base are thin, and the thickness of the InPSb sublayers in subsequent periods increases as the period layers progress towards the emitter. Conversely, the InAs sublayers in the period layers nearest the base are thick, but decrease in thickness in subsequent period layers as the period layers are closer to the emitter.

In general, for a linear change in material, the fraction of the period layer of sublayers, in a superlattice having N period layers, shifts between adjacent sublayers by an amount which is: (total shift over the grading layer)/(1+N). Thus, for N=9, the shift between adjacent period layers will be 10% of the total shift across the grading layer, while for N=19, the shift between adjacent period layers will be 5% of the total shift across the grading layer.

For example, a typical superlattice might employ a n=9 period layers. Each period layer would contain a first sublayer of InP$_{0.69}$Sb$_{0.31}$ and a second sublayer of InAs. For a linear (i.e. equal step-size) shift, for materials shifting from 0% of the grading material at one end of the grading layer, to 100% of the grading material at the other end of the grading layer, the thickness of the first sublayers would be varied from 10% of the thickness of the first layer period at the collector end, and increased by 10% in each successive period layer step, until they form 90% of the period layer at the base end of grading layer 15. Conversely, the second sublayers would be reduced from 90% of the thickness of the layer period nearest the collector, in 10% steps, until the second sublayer is only 10% of the layer period nearest the base.

The number of layer periods n in grading layer 15 may be varied over a wide range from about 5 to 50 layer periods. Other compounds than those described may also be used to create a chirped superlattice grading layer.

Whether a chirped superlattice or a continuously varied InPSbAs quaternary compound is used for the grading layer is a matter of design choice, in that different advantages flow from each choice. For example, a chirped superlattice is more easily fabricated, having a wider tolerance for growth conditions and requiring a smaller range of materials for the typical MBE or MOVPE facility. However, electron mobility through a chirped superlattice is somewhat lower than in a continuously varied quaternary compound. The latter process requires tight control of growth conditions, but results in somewhat higher cut-off frequency due to higher electron mobility.

Delta Doping

Two delta doping layers 17(a) and 18(a) of the same concentration are provided at the ends of grading layer 15. Acceptor layer 18(a), typically a two-dimensional layer of Be atoms, provides acceptors at the base end, and donor layer 17(a), typically a two-dimensional layer of Si atoms, provides donors at the emitter end, thus forming a dipole. The sheet doping density σ of layers 17(a) and 18(a) depend upon the thickness L of grading layer 15 according to the equation:

$$\sigma = \epsilon \Delta E_C / qL,$$

where $\epsilon$, $\Delta E_C$, q are the dielectric constant of graded layer 15, the desired electrostatic field, and the charge of an electron, respectively. Thus, if grading layer 15 is 50 nm thick, then an appropriate sheet doping density is $4.3 \cdot 10^{11}$ cm$^{-2}$. As a result, the quasi-electric field created by the linear bandgap variation due to linear material grading is canceled by the electrostatic field arising from the ionized impurities in the doping sheets.

The emitter is formed from emitter layer 16 of n-type InPSb, preferably doped to a concentration of about $4 \cdot 10^{17}$ cm$^{-3}$ using a standard dopant such as Si. Emitter layer 16 typically has a thickness of about 3000 Å, but of course may vary widely depending upon application.

Since masking and etching of semiconductor layers in order to form semiconductor devices is well known in the art, those details are left to the artisan. After suitable etching, metal collector contact 20 is formed on subcollector layer 11, metal base contact 21 is formed on base layer 14, and metal emitter contact 22 is formed on emitter 16. Metal base contact 21 typically surrounds most of emitter contact 22, and thus appears as two pieces in this cross-section view. Collector contact 20 is preferably a Ti/Au metal contact, while base contact 21 is preferably a Ti/Pt/Au metal contact. Emitter contact 22 is preferably a Ti/Au contact. Heat treatment of the metal contacts is not necessary, but may be used, for example, to anneal the contacts in order to enhance the ohmic contact.

Figure 6:
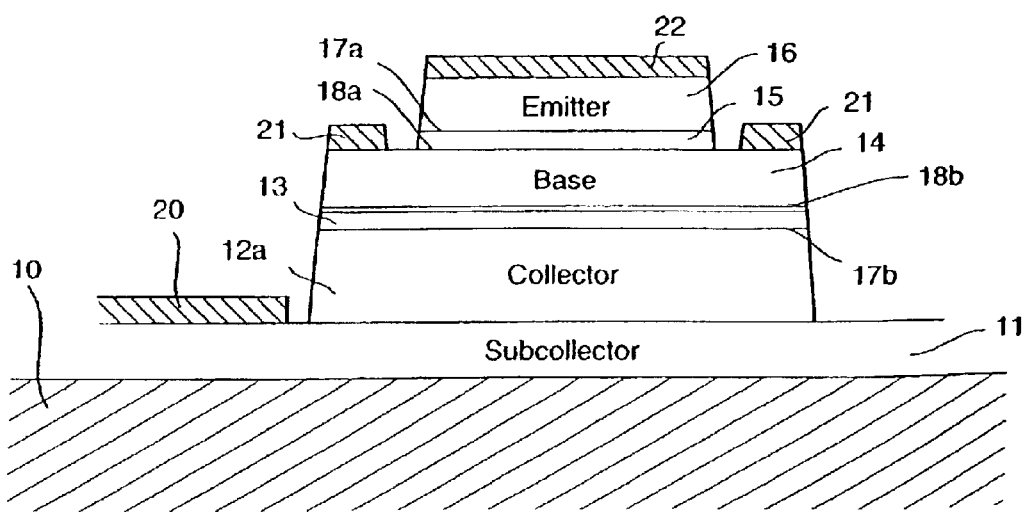
FIG. 6 depicts an Sb-based DHBT device which utilizes the concepts related above.

FIG. 6 depicts a Sb-based DHBT device which utilizes the concepts related above. Generally speaking this device is nearly identical to the device described with reference to FIG. 5 and thus the following discussion will focus on the differences. Since many of the layers are of the same construction as that described with reference to FIG. 5, the same reference numerals are used where the layers and/or contacts are the same or similar to that just described.

The device of FIG. 6 is formed on a suitable substrate 10 such as InAs or GaSb. Lattice-matching is preferred, but bandgap does not matter. Accordingly, if substrate 10 is InAs then subcollector layer 11 is preferably doped n$^+$ InAs; whereas if substrate 10 is GaSb, then subcollector layer 11 is preferably doped n$^+$ InP$_{0.91}$Sb$_{0.009}$. So far, this is the same as the SHBT of FIG. 5. However, if substrate 10 is InAs, then collector layer 12a is preferably InP$_{0.69}$Sb$_{0.31}$ instead of InAs, in order to obtain the larger bandgap desired for the collector. (Subcollector layer 11 of FIG. 6 may also be InP$_{0.69}$Sb$_{0.31}$.) Layer 12a has a thickness of typically about 5000 Å, though the thickness may vary widely depending upon application, and is n-type doped to typically about $5 \cdot 10^{15}$ cm$^{-3}$ (doping density will also vary widely depending upon application). Since collector layer 12a is now InPSb, a grading layer 13 is utilized between the InPSb collector and the InAs base for the reasons previously stated. The grading layer 13 is formed on the collector layer 12a, separating it from base layer 14. Grading layer 13 typically has, as previously mentioned, a thickness of about 50 nm. The grading layer 13 may be either an InPSb/InAs chirped superlattice or an InPSbAs quaternary compound formed by continuously varying the y-parameter of the quaternary In(P$_{0.69}$Sb$_{0.31}$)$_y$As$_{1-y}$ from 0 at the base layer 14 to 1 at the InPSb collector layer 12a. It is formed as is base-emitter grading layer 15 of FIG. 5, spatially inverted so that the collector side of grading layer 13 matches the emitter side of grading layer 15, and the base side of grading layer 13 matches the base side of grading layer 13.

Still in FIG. 6, the collector end of grading layer 13 terminates in delta doping layer 17(b), which is equivalent to layer 17(a) at the base end of grading layer 15. The base end of grading layer 13 similarly terminates in delta doping layer 18(b), equivalent to layer 18(a). The sheet charge of layers 17(a) and 18(a) of FIG. 6 are calculated as explained with respect to FIG. 5, as is the sheet charge of layers 17(b) and 18(b).

Also in FIG. 6, for the case in which substrate 10 is GaSb, it is then preferred that collector layer 12a is InPSb lattice matched to GaSb, or approximately InP$_{0.63}$Sb$_{0.37}$. Collector-base grading layer 13 will be adjusted accordingly to grade from the collector material to the emitter material. Thicknesses and doping densities are in the same ranges as with an InAs substrate. Subcollector layer 11 may for convenience be of the same material as collector layer 12a.

The SHBT and DHBT devices described herein utilize a new combination of materials for emitter, base and collector. Functionally, these devices replace prior art InP ShBT and DHBT device, particularly in high speed and/or high power applications. For the same device geometry as used in the prior art, the new combinations will be able to operate at much higher frequencies than is possible using current state of the art InP HBT devices. Furthermore, the turn-on voltage of these new devices is about 0.3 V, which is significantly less than the 0.6 V turn-on voltage for InP based HBT devices. This reduction in turn-on voltage will result in a significant reduction (>2 times) in power consumption for equivalent digital signal processing circuits. In addition, the low contact and sheet resistance for the materials used (in particular the InAs base layer) will lead to reduced parasitics and hence enable further reductions in device sizes and concomitant further increases in device speeds and reductions in power consumption.

Having described the invention in connection with two embodiments thereof, modification will now certainly suggest itself to those skilled in the art. As such the invention is not to be limited to the disclosed embodiment except as required by the appended claims.

What is claimed is:

1. A bipolar junction transistor device comprising a base, an emitter and a collector, said base being predominantly doped InAs and at least one of said emitter and collector including InPSb.

2. A device according to claim 1 in which semiconductor material of the base differs from semiconductor material of the emitter such that a junction between the base and emitter is a heterojunction and the device is a heterojunction bipolar transistor.

3. A device according to claim 2 wherein the base is p-doped and includes indium and arsenic, and the device is an npn transistor.

4. A device according to claim 2 wherein said base-emitter heterojunction includes a grading layer.

5. A device according to claim 4 wherein said base-emitter heterojunction includes a delta doping plane disposed within 50 Å of each end of said grading layer.

6. A device according to claim 5 wherein the base is p-doped and includes indium and arsenic, and the emitter is n-doped and includes indium, phosphorus and antimony.

7. A device according to claim 6 wherein the collector includes indium and arsenic.

8. A device according to claim 6 wherein the collector includes indium, phosphorus and antimony, such that the device is a double heterojunction bipolar transistor.

9. A device according to claim 6 wherein the collector and the emitter are lattice-matched to GaSb.

10. A bipolar transistor having a base, an emitter and a collector, the base being formed of doped InAs or doped InAsSb and the emitter being formed of doped InPSb.

11. The bipolar transistor of claim 10 wherein the collector is formed of doped InPSb.

12. The bipolar transistor of claim 10 wherein the base is doped to be of a first conductivity type and wherein the collector is formed of the same semiconductor materials as the base, but is doped to be of a second conductivity type.

13. The bipolar transistor of claim 10 wherein the semiconductor material of the base differs form the semiconductor material of the emitter such that a junction between the base and the emitter is a heterojunction and the transistor is a heterojunction bipolar transistor.

14. The bipolar transistor of claim 13 wherein the base-emitter heterojunction includes a grading layer.

15. The bipolar transistor of claim 14 wherein the base-emitter heterojunction includes a delta-doping plane disposed within 50 Å of each end of said grading layer.

16. The bipolar transistor of claim 10 wherein the collector is lattice matched to GaSb.

17. The bipolar transistor of claim 10 wherein the emitter is lattice matched to GaSb.

18. A bipolar junction transistor device comprising a base, an emitter and a collector, said base and collector being predominantly doped InAs and said emitter including lnPSb.

19. A device according to claim 18 in which a junction between the base and emitter is a heterojunction and the device is a heterojunction bipolar transistor.

20. A device according to claim 19 wherein said base-emitter heterojunction includes a grading layer.

21. A heterojunction bipolar transistor comprising a base, an emitter and a collector, at least one of said base and collector being predominantly doped InAs, a junction formed between the base and emitter being a heterojunction, said junction including a grading layer.

22. A transistor according to claim 21 wherein said base-emitter heterojunction includes a delta doping plane disposed within 50 Å of each end of said grading layer.

23. A transistor according to claim 22 wherein the base is p-doped and includes indium and arsenic, and the emitter is n-doped and includes indium, phosphorus and antimony.

* * * * *